United States Patent

(12) United States Patent
Sato

(10) Patent No.: US 9,536,933 B2
(45) Date of Patent: Jan. 3, 2017

(54) DISPLAY DEVICE HAVING A LIGHT EMITTING LAYER ON THE AUXILIARY LAYER

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/922,793

(22) Filed: Oct. 26, 2015

(65) Prior Publication Data

US 2016/0155785 A1   Jun. 2, 2016

(30) Foreign Application Priority Data

Nov. 28, 2014   (JP) ................. 2014-240887

(51) Int. Cl.
| H01L 27/15 | (2006.01) |
| H01L 31/12 | (2006.01) |
| H01L 33/00 | (2010.01) |
| H01L 27/32 | (2006.01) |
| H01L 51/50 | (2006.01) |

(52) U.S. Cl.
CPC ....... *H01L 27/3246* (2013.01); *H01L 27/3211* (2013.01); *H01L 51/5056* (2013.01); *H01L 51/5088* (2013.01)

(58) Field of Classification Search
CPC .. H01L 27/32; H01L 27/3202; H01L 27/3204; H01L 27/3209; H01L 27/3225; H01L 27/3251; H01L 27/3258; H01L 2227/32; H01L 2914/12044
See application file for complete search history.

(56) References Cited

U.S. PATENT DOCUMENTS

| 2010/0232162 A1 | 9/2010 | Shin et al. |
| 2012/0187425 A1 | 7/2012 | Omoto |
| 2014/0021467 A1* | 1/2014 | Koezuka ........... H01L 29/66742 257/43 |
| 2014/0124765 A1 | 5/2014 | Omoto |

FOREIGN PATENT DOCUMENTS

JP   2012-155953 A   8/2012

* cited by examiner

*Primary Examiner* — Hoai V Pham
(74) *Attorney, Agent, or Firm* — Typha IP LLC

(57) ABSTRACT

A display device, in which self-luminous elements are arranged, prevents a leakage current through a common layer, provided for the self-luminous elements and disposed throughout its image display area, from causing adjacent pixels to emit unintended light. A light-emitting element layer 102 includes a lower layer 102d and a light-emitting layer. The lower layer 102d has carrier mobility and includes a carrier transport layer or a carrier injection layer. The lower layer 102d is stacked on lower electrodes 100 and banks 106. The light-emitting layer is stacked on the lower layer 102d. An upper electrode 62 is disposed on the light-emitting element layer 102 and supplies carriers to the light-emitting element layer 102 together with each lower electrode. A lower layer 102d has a dividing area 112 on the bank. The dividing area 112 prevents carriers from traveling between adjacent pixels through the lower layer 102d.

10 Claims, 5 Drawing Sheets

DISPLAY DEVICE HAVING A LIGHT EMITTING LAYER ON THE AUXILIARY LAYER

CROSS-REFERENCE TO RELATED APPLICATION

The present application claims priority from Japanese application JP2014-240887 filed on Nov. 28, 2014, the content of which is hereby incorporated by reference into this application.

BACKGROUND OF THE INVENTION

1. Field of the Invention

The present invention relates to a display device using self-luminous elements that emit light by application of a voltage.

2. Description of the Related Art

Display devices using self-luminous elements such as organic light-emitting electroluminescent (EL) elements have been developed. The organic electroluminescent element is a type of light-emitting diode usually called an organic light-emitting diode (OLED). The OLED emits light when carriers (electrons or holes) are injected into its light-emitting layer made of organic compounds. The OLED typically has a structure including an auxiliary layer with carrier mobility, for example, between an electrode and the light-emitting layer so that carriers are efficiently injected into the light-emitting layer during application of a voltage.

For example, a hole transport layer (HTL) and a hole injection layer (HIL), each as an auxiliary layer, are disposed between the anode and the light-emitting layer. In addition, an electron transport layer (ETL) and an electron injection layer (EIL) are disposed between the cathode and the light-emitting layer. These auxiliary layers are formed in common throughout an image display area in which a plurality of pixels are arranged, for example, by chemical vapor deposition (CVD), sputtering, or vacuum evaporation.

SUMMARY OF THE INVENTION

A display device using light-emitting elements in which an auxiliary layer with carrier mobility, such as the HTL and the HIL in the OLED described above, is formed as a common layer lying continuously throughout its image display area may cause the leakage of carriers through the common layer between adjacent pixels. The leakage current that flows to adjacent pixels causes the adjacent pixels to emit unintended light. Specifically, the leakage current causes deterioration in resolution of images. Moreover, the leakage current that flows between different pixels of different luminescent colors causes reduction in color reproducibility (color purity). In particular, as the openings (or the light-emitting areas) of adjacent pixels get closer to each other with increasing definition due to smaller pixel size, these problems become more pronounced.

The present invention provides a display device that prevents a leakage current from flowing to self-luminous elements in adjacent pixels and causing the adjacent pixels to emit unintended light.

A display device according to an aspect of the present invention includes a plurality of pixels, pixel electrodes each provided in each of the pixels, a bank that is positioned in a border between the pixels and exposes part of each of the pixel electrodes, an auxiliary layer that includes at least one of a carrier transport layer and a carrier injection layer and is stacked on the pixel electrodes and the bank, a light-emitting layer stacked on the auxiliary layer, and a counter electrode that is positioned on the light-emitting layer and spreads over the pixels. In the display device, the auxiliary layer may have a dividing area on the bank, and the dividing area may have lower carrier mobility than the other area has, which is different from the dividing area, in the auxiliary layer. The auxiliary layer in a display device according to another aspect of the present invention may be divided on the top of the bank so as to correspond to the each of the plurality of pixels.

DETAILED DESCRIPTION OF THE INVENTION

Embodiments of the present invention will now be described with reference to the accompanying drawings.

The disclosure herein is merely an example, and appropriate modifications coming within the spirit of the present invention, which are easily conceived by those skilled in the art, are intended to be included within the scope of the invention as a matter of course. The accompanying drawings schematically illustrate widths, thicknesses, shapes, or other characteristics of each part for clarity of illustration, compared to actual configurations. However, such schematic illustrations are merely examples and are not intended to limit the present invention. In the present specification and drawings, some elements identical or similar to those shown previously are denoted by the same reference signs as the previously shown elements, and thus are not described in detail herein as appropriate.

A display device in each embodiment described below is an organic EL display device. The organic EL display device is an active matrix display device and is built in televisions, personal computers, handheld devices, mobile phones, and other devices.

A plurality of pixels for producing images are arranged two-dimensionally in the image display area of the display device. Here, the direction along one coordinate axis of a two-dimensional Cartesian coordinate system corresponding to an image is defined as the row direction, and the direction along the other coordinate axis of the coordinate system is defined as the column direction. In the following description, merely for convenience, the row direction and the column direction are basically defined as the horizontal direction and the vertical direction of the image, respectively. For example, for such a display device as can switch the orientation of an image displayed in the same image display area between portrait and landscape modes, the row direction and the column direction of the image display area may be the vertical direction and the horizontal direction of the image, respectively. The structure itself of the display device can be such that its physical orientation is changed between row and column directions relative to structures described below.

Each of the following embodiments describes a display device that can display color images. The display device has a plurality of types of sub-pixels of mutually different luminescent colors arranged in its image display area. Each pixel in the color images corresponds to a sub-pixel group constituted by a plurality of types of sub-pixels in the display device, whereas a single sub-pixel is the structural unit in the display device. For example, an OLED and a pixel circuit are formed for each sub-pixel. For this reason, in the following description, each sub-pixel is basically referred to as a pixel.

First Embodiment

Figure 1:
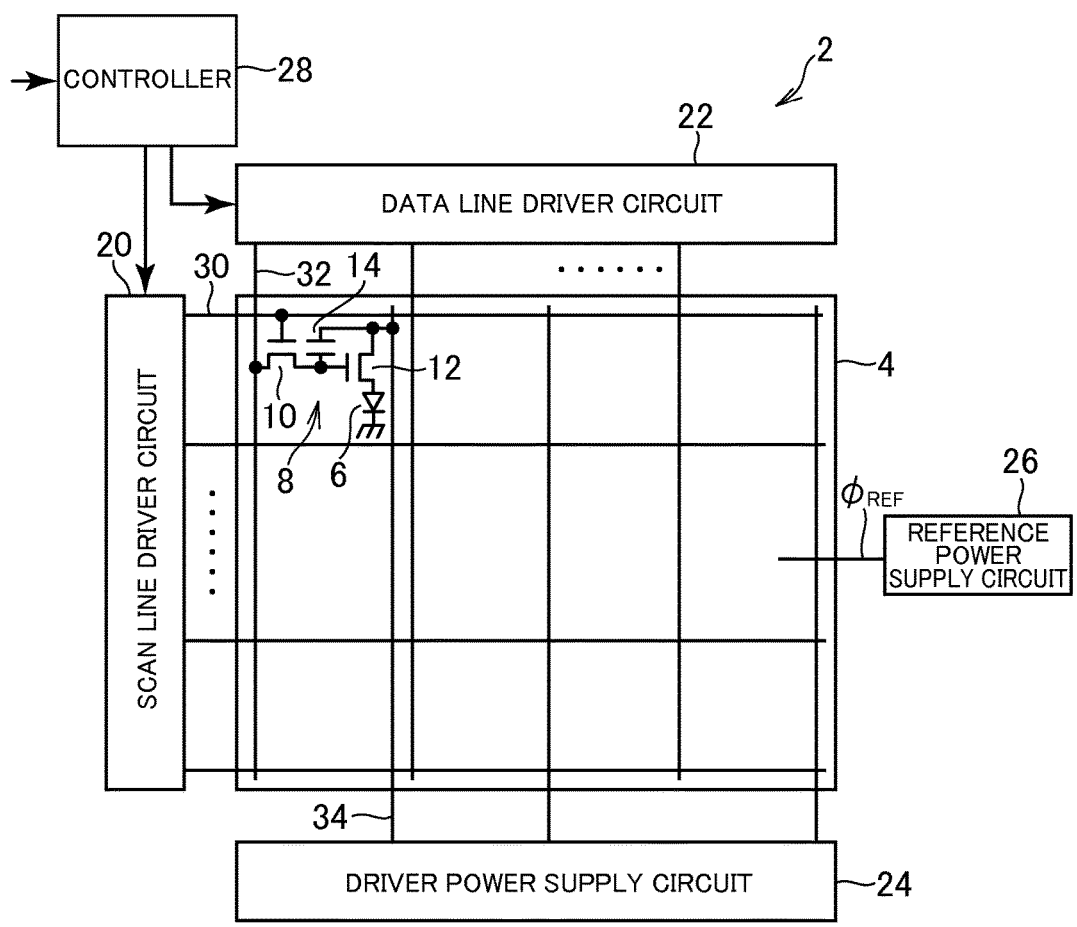
FIG. 1 is a schematic diagram showing a configuration of an organic EL display device according to an embodiment of the present invention.

FIG. 1 is a schematic diagram showing a configuration of an organic EL display device 2 according to an embodiment. The organic EL display device 2 includes a pixel array unit 4 that displays images and a driver that drives the pixel array unit 4. The organic EL display device 2 includes a substrate and a stack structure on the substrate. The substrate is made of, for example, a glass substrate or a flexible resin film. The stack structure includes thin film transistors (TFTs) and OLEDs.

In the pixel array unit 4, OLEDs 6 and pixel circuits 8, each corresponding to a pixel, are arranged in a matrix. Each pixel circuit 8 includes TFTs 10 and 12 and a capacitor 14.

The driver includes a scan line driver circuit 20, a data line driver circuit 22, a driver power supply circuit 24, a reference power supply circuit 26, and a controller 28. For example, the driver is responsible for driving the pixel circuits 8 to control the light emission of the OLEDs 6.

The scan line driver circuit 20 is connected to scan lines 30, each provided for the corresponding horizontal pixel alignment (pixel row). The scan line driver circuit 20 sequentially selects the scan lines 30 in response to timing signals input from the controller 28, and applies, to each selected scan line, a voltage enough to turn on the corresponding lighting TFT 10.

The data line driver circuit 22 is connected to data lines 32, each provided for the corresponding vertical pixel alignment (pixel column). The data line driver circuit 22 receives image signals from the controller 28. In synchronization with the selection of the scan line 30 by the scan line driver circuit 20, the data line driver circuit 22 outputs voltages, which correspond to an image signal for the selected pixel row, to the data lines 32. In the selected pixel row, each of the voltages is written into the corresponding capacitor 14 via the lighting TFT 10. Each driver TFT 12 supplies a current, which corresponds to the written voltage, to the corresponding OLED 6. Thus, the OLEDs 6 in the pixels corresponding to the selected scan line 30 emit light.

The driver power supply circuit 24 is connected to drive power lines 34, each provided for the corresponding pixel column, and supplies a current to the OLEDs 6 via the drive power lines 34 and the driver TFTs 12 in the selected pixel row.

The reference power supply circuit 26 applies a constant potential $\phi_{REF}$ to a common electrode (not shown) constituting the cathode electrodes of the OLEDs 6 The potential $\phi_{REF}$ can be set to, for example, ground potential GND (0 V).

In this embodiment, the lower electrode of the OLED 6 is a pixel electrode formed for each pixel, and the upper electrode of the OLED 6 is a counter electrode disposed to face the pixel electrode. The lower electrode is connected to the driver TFT 12. In contrast, the upper electrode is constituted by the electrode common to the OLEDs 6 of all the pixels. In this embodiment, the lower electrode is the anode of the OLED 6 and the upper electrode is the cathode.

Figure 2:
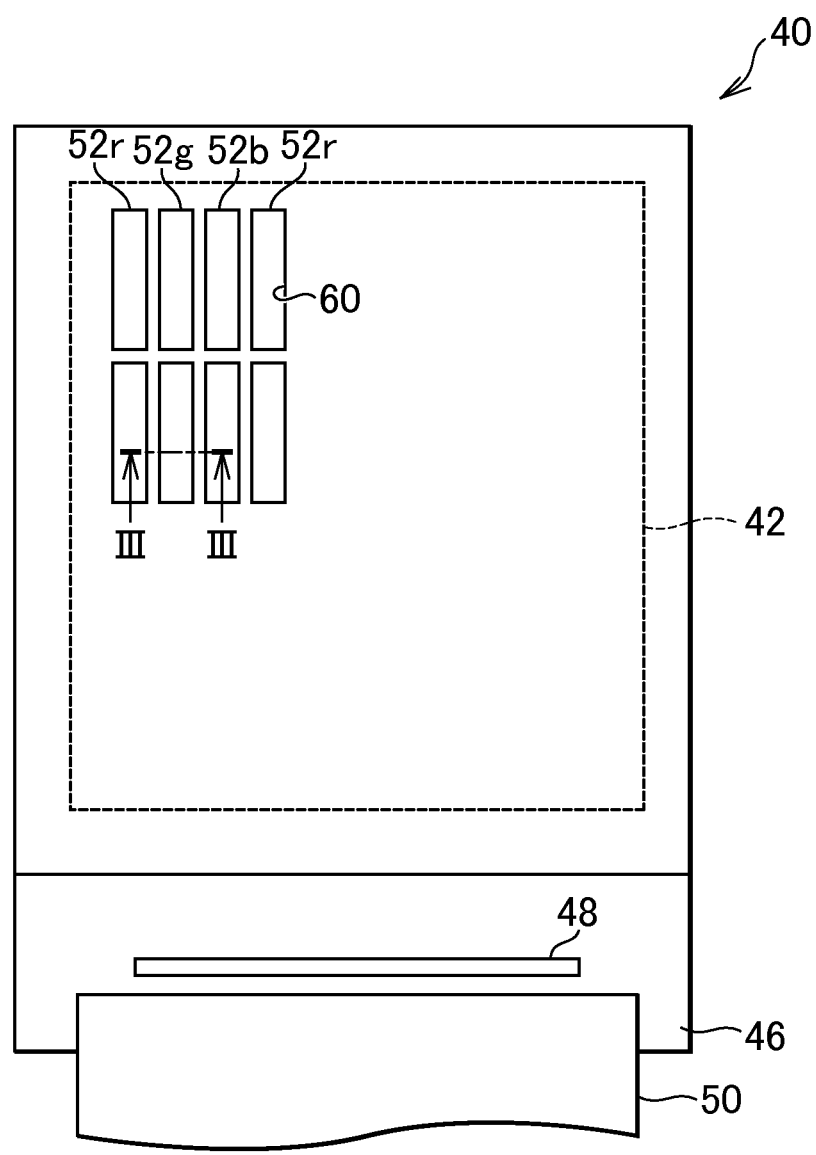
FIG. 2 is a schematic plan view of a display panel of the organic EL display device according to the embodiment of the present invention.

FIG. 2 is a schematic plan view of a display panel 40 of the organic EL display device 2. The pixel array unit 4 shown in FIG. 1 is disposed in a display area 42 of the display panel 40. As described above, the OLEDs 6 are arranged in the pixel array unit 4. A component mounting area 46 is provided near one side of the rectangular display panel 40, and wirings connected to the display area 42 are disposed on the component mounting area 46. In addition, a driver IC 48 constituting the driver is mounted on the component mounting area 46, and a FPC 50 is connected to the component mounting area 46. The FPC 50 is connected to the controller 28, the circuits 20, 22, 24, 26, and other circuits, and has an IC on it.

The display panel 40 in this embodiment displays color images. Each pixel in the color images is constituted by, for example, three types of pixels (sub-pixels) that emit light corresponding to red (R), green (G), and blue (B).

This embodiment describes an example where R pixels 52r, G pixels 52g, and B pixels 52b are arranged in a stripe matrix in the display area 42. In this arrangement, the pixels of the same type (color) are arranged in the vertical direction of the images, and the R, G, and B pixels are arranged cyclically in the horizontal direction. In FIG. 2, each of the R pixels 52r, the G pixels 52g, and the B pixels 52b schematically represents an effective light-emitting area and structurally corresponds to a pixel opening 60. The area between these pixels corresponds to a bank.

For example, the display panel 40 has a structure including a TFT substrate and a counter substrate bonded to each other with a filler sandwiched between these substrates. The TFT substrate has the OLEDs 6 and a circuit including, for example, TFTs 72 formed on it. The counter substrate can be provided with a polarizing plate and a touch screen. When the display panel 40 produces color images by using a color filter, for example, the counter substrate has the color filter formed on it, and white light generated by the OLEDs 6 passes through the color filter to provide each color of RGB.

Figure 3:
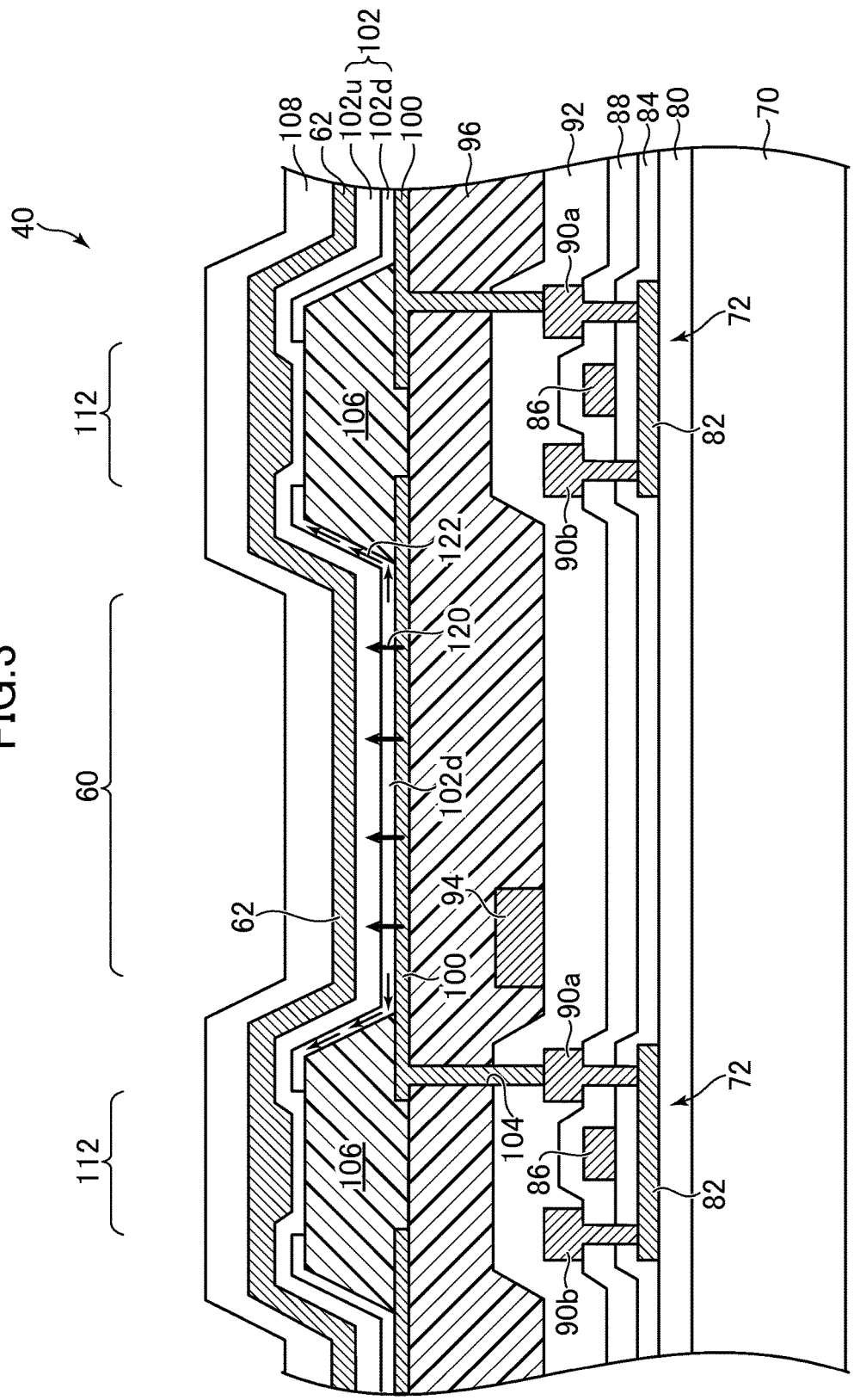
FIG. 3 is a schematic vertical cross-sectional view of a display panel according to a first embodiment of the present invention taken along line III-III shown in FIG. 2.

FIG. 3 is a schematic vertical cross-sectional view of the display panel 40 taken along line III-III shown in FIG. 2. FIG. 3 shows the cross-sectional structure of the above TFT substrate, whereas a filler layer formed on this and the structure of the counter substrate are not shown. The pixel array unit 4 in this embodiment is a top-emitting unit and emits light, which is generated by the OLEDs 6 formed on the TFT substrate, through the counter substrate. That is, the light from the OLEDs 6 are emitted upward in FIG. 3.

The structure of the TFT substrate is formed by stacking and patterning various types of layers on a substrate 70 made of glass or a resin film.

Specifically, a polysilicon (p-Si) film is formed on the substrate 70 via an underlayer 80 made of an inorganic insulating material, such as silicon nitride ($SiN_y$) or silicon oxide ($SiO_x$), and then the p-Si film is patterned so that p-Si films to be regions used in a circuit layer are selectively left. For example, each p-Si film forms a semiconductor region 82 to be the channel, the source, and the drain of the top-gate TFT 72. A gate electrode 86 is disposed on the channel of the TFT 72 via a gate insulating film 84. The gate electrode 86 is formed by patterning a metal film formed, for example, by sputtering. Then, an interlayer insulating film 88 covering the gate electrode 86 is stacked. The p-Si to be the source and the drain of the TFT 72 is doped with a dopant by ion implantation. Then, a source electrode 90a and a drain electrode 90b, each electrically connected to the p-Si, are formed. After the TFT 72 is thus formed, an interlayer insulating film 92 is stacked. On the surface of the interlayer insulating film 92, interconnections 94 and other interconnections can be formed by patterning a metal film formed, for example, by sputtering. This metal film can constitute, for example, a multilayer interconnection structure including the scan lines 30, the data lines 32, and the drive power lines 34 shown in FIG. 1, together with the metal film used to form the gate electrodes 86, the source electrodes 90a, and the drain electrodes 90b. On this structure, for example, a planarization film 96 is formed by stacking an organic material, such as an acrylic resin. On the surface of the display area 42 thus planarized, the OLEDs 6 are formed.

Each OLED 6 is constituted by a lower electrode 100, a light-emitting element layer 102, and the upper electrode 62, which are stacked in this order from the substrate 70.

Assuming that the TFT 72 shown in FIG. 3 is the driver TFT 12 having an n channel, the lower electrode 100 is connected to the source electrode 90a of the TFT 72. Specifically, after the above planarization film 96 is formed, contact holes 104, each for coupling the lower electrode 100 to the corresponding TFT 72, are formed. Then, the lower electrode 100 connected to the TFT 72 is formed separately for each pixel by patterning a conductive film formed on the surface of the planarization film 96 and in the contact holes 104.

For example, the lower electrode 100 is formed of ITO or IZO. The organic EL display device 2 in this embodiment is a top-emitting device, so that the lower electrode 100 can have a structure in which a transparent conductive film is stacked on a reflective layer formed of a highly light-reflective material. For example, the reflective layer can be formed of aluminum (Al) or silver (Ag), and reflects light form the light-emitting layer toward the display surface, that is, toward the upper electrode 62.

As described above, in each pixel, the driver TFT 12 controls a current flowing through the OLED 6 in response to an image signal for the pixel, and the lower electrode 100 supplies as many carriers as correspond to the image signal for the pixel to the light-emitting element layer 102. Specifically, in this embodiment, the lower electrode 100 is the anode, and holes as carriers are supplied from the lower electrode 100 to the light-emitting element layer 102.

FIGS. 4A to 4E are each a partial cross-sectional views of the TFT substrate in a main step of forming the OLEDs 6. These figures show a schematic process flow of a manufacturing process of the display panel 40 after formation of the lower electrodes 100. The following describes how the OLEDs 6 are formed with reference to FIGS. 4A to 4E.

Figure 4A:
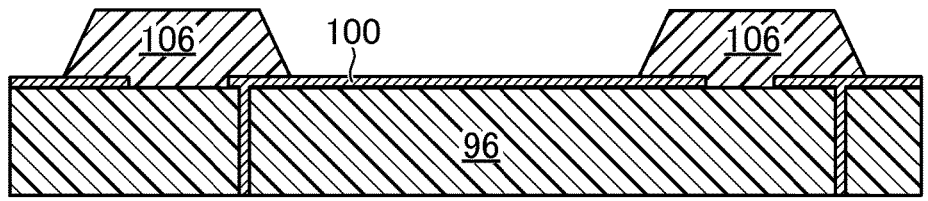
FIGS. 4A to 4E are each a partial cross-sectional view of a TFT substrate in a main step of forming OLEDs 6.

After formation of the lower electrodes 100, a bank 106 is formed (FIG. 4A). The bank 106 is formed in the pixel border, for example, by patterning a photosensitive resin, such as acryl or polyimide, using photolithography or ink-jet printing so as to electrically separate the lower electrodes 100 from each other. The bank 106 can be formed of an inorganic insulating material, such as $SiN_y$ or $SiO_x$. The areas enclosed by the bank 106 correspond to the pixel openings 60 shown in FIG. 2, and the lower electrodes 100 are exposed through the areas.

After the bank 106 is formed, layers constituting the light-emitting element layer 102 are sequentially stacked on the lower electrodes 100. The light-emitting element layer 102 includes a light-emitting layer (EML) and an auxiliary layer. The light-emitting layer emits light in response to the injection of carriers. The auxiliary layer is responsible for efficiently supplying the carriers to the light-emitting layer. The light-emitting element layer 102 includes at least one of a HIL and a HTL as the auxiliary layer.

For example, each OLED 6 is an OLED that emits single-color light corresponding to the luminescent color of one of the R, G, and B pixels, and has a structure in which the HIL, the HTL, the EML, and an ETL are stacked in this order from the lower electrode 100. In this structure, the HIL, the HTL, and the ETL are each the auxiliary layer. Among these, the HIL and the HTL are formed between the EML and the anode (lower electrode 100), which supplies holes. FIG. 3 distinguishably shows a lower layer 102d including the HIL and the HTL, and an upper layer 102u including the EML and the ETL, which constitute the light-emitting element layer 102.

Figure 4B:
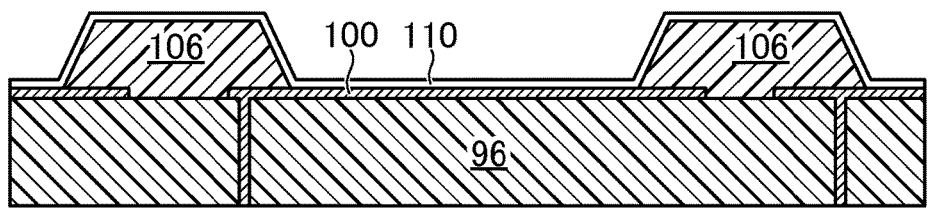

After formation of the bank 106, the lower layer 102d is formed first. For example, the HTL and HIL constituting the lower layer 102d is formed of poly(3,4-ethylenedioxythiophene):poly(styrenesulfonate) (PEDOT:PSS) or other conductive organic materials. Throughout the surface of the display area 42 in which the bank 106 is formed, a HTL/HIL layer 110 is deposited, for example, by sputtering or CVD (FIG. 4B).

Figure 4C:
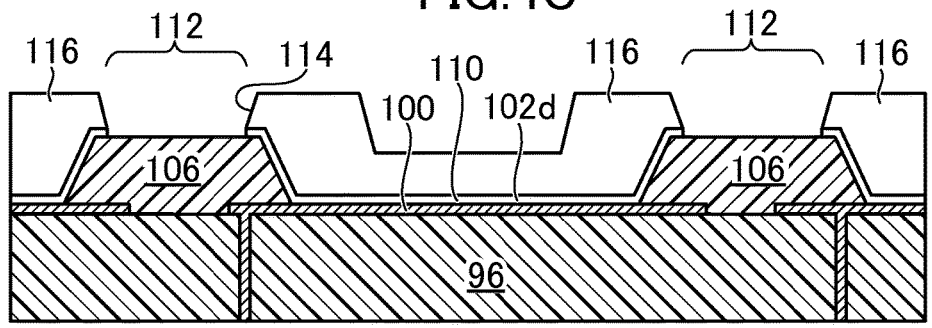
Figure 4D:
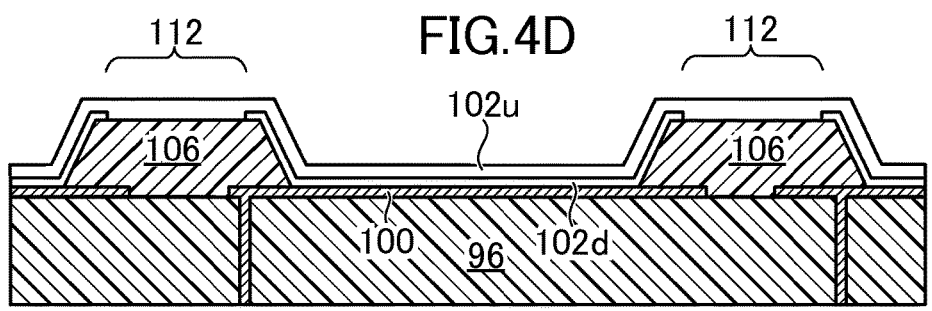
Figure 4E:
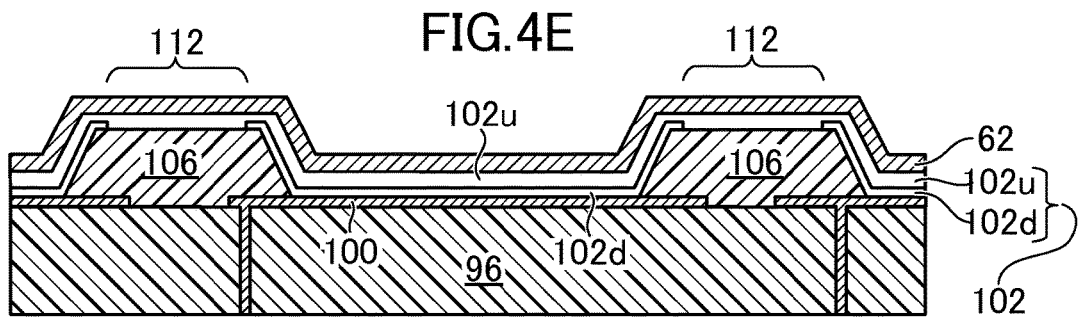

Subsequently, a dividing area 112 that divides the HTL/HIL layer 110 is formed on the bank 106 (FIG. 4C), and the HTL/HIL layer 110 in the remaining area becomes the lower layer 102d of the light-emitting element layer 102 (FIGS. 4D and 4E). The dividing area 112 is responsible for preventing carries from traveling between adjacent pixels through the HTL/HIL layer 110. As shown in the figures, the bank 106 has more than enough width to have the dividing area 112 on it, and thus the edge of the lower layer 102d can overlap with the surface of the bank 106.

In this embodiment, the dividing area 112 is the area where no HTL/HIL layer 110 is formed. For example, the dividing area 112 is formed by removing part of the HTL/HIL layer 110 by patterning with photolithography. Specifically, a photoresist film is formed on the surface of the HTL/HIL layer 110, and a mask 116 having an opening 114 in the area to be the dividing area 112 is formed by using the photoresist film. Then, by using the mask 116, HTL/HIL layer 110 is etched away from the opening 114 (FIG. 4C).

As the lower layer 102d, the HTL/HIL layer 110 can be formed to have a pattern with the dividing area 112 from the beginning, for example, by a printing method.

Subsequently, on the lower layer 102d, the EML and the ETL are formed as the upper layer 102u throughout the display area 42 (FIG. 4D). For example, the upper layer 102u is formed by vapor deposition. For the OLEDs each of which emits single-color light, the EML is formed of different organic light-emitting materials for different luminescent colors. In this case, the EML can be formed, for example, by ink-jet printing.

On the light-emitting element layer 102 including the lower layer 102d and the upper layer 102u, the upper electrode 62 is deposited, for example, by sputtering (FIG. 4E). The upper electrode 62 is basically formed in common throughout the display area 42.

In this way, the OLEDs 6 are formed. On the surface of the upper electrode 62, a sealing film 108 is formed, as shown in FIG. 3. The sealing film 108 prevents moisture from entering and is responsible for protecting the OLEDs 6. As the sealing film 108, for example, a $SiN_y$ film is deposited by CVD.

The display panel 40 may have a structure in which the TFT substrate and the counter substrate are not bonded to each other. In this case, a protective film can be formed over or under the sealing film 108, or both over and under the sealing film 108 to increase the mechanical strength of the surface of the TFT substrate. When a protective film is formed under the sealing film 108, the protective film may be formed to effectively compensate for the irregularities due to the bank 106 and thus to reduce the surface irregularities of the sealing film 108. This can reduce the internal stress of the sealing film 108 and make the sealing film 108 less likely to peel off.

Figure 5:
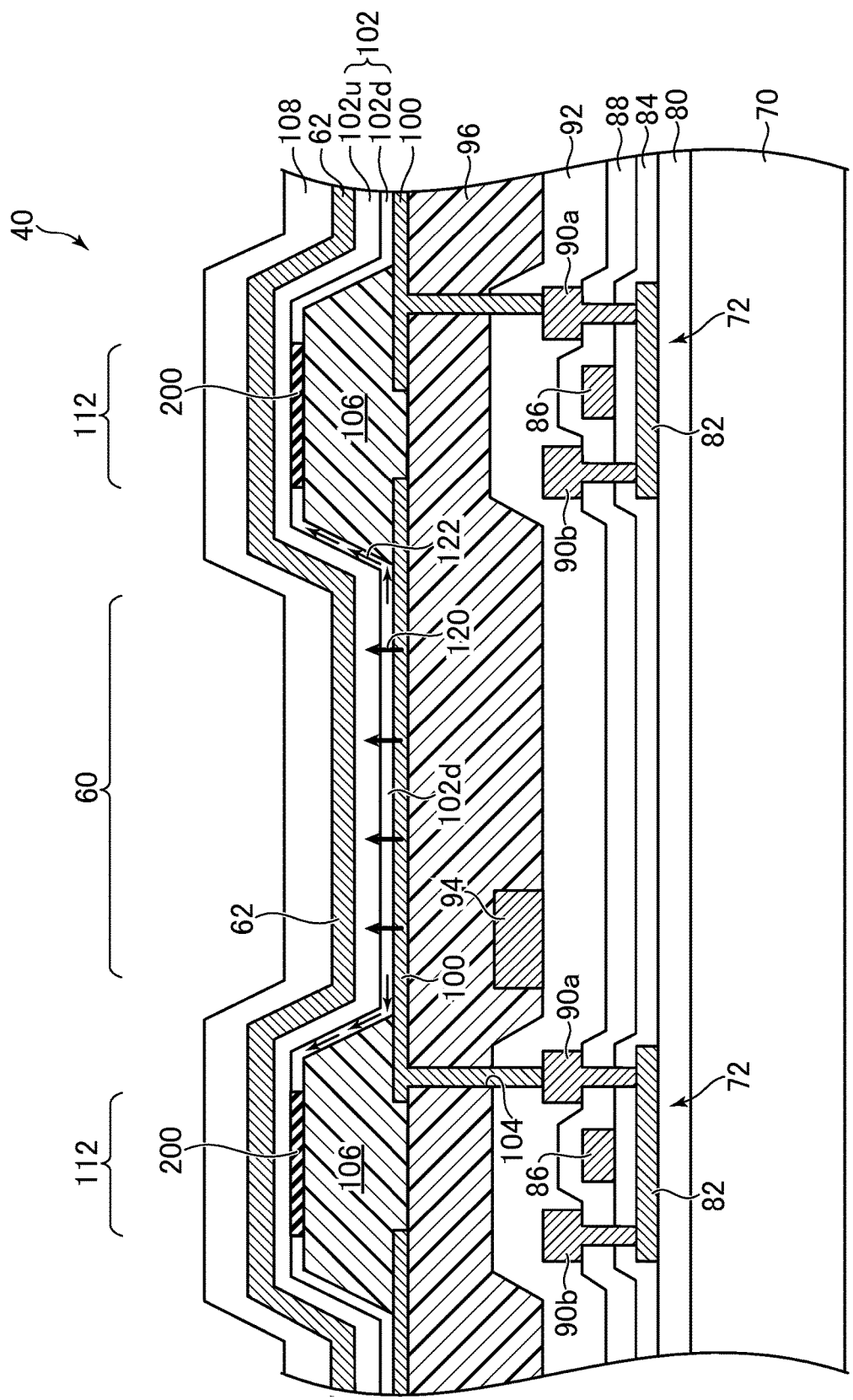
FIG. 5 is a schematic vertical cross-sectional view of a display panel according to a second embodiment of the present invention taken along line III-III shown in FIG. 2.

As described above, when the organic EL display device 2 is driven, the OLED 6 of each pixel, to which carriers corresponding to an image signal are supplied, emits light. In FIG. 5, arrows schematically indicate the flow of holes that are carriers supplied from the lower electrode 100 to the light-emitting element layer 102 when the organic EL display device 2 is driven. A potential lower than that of the lower electrode 100 is applied to the upper electrode 62. The holes supplied from the lower electrode 100 of each pixel to the lower layer 102d of the light-emitting element layer 102 are drawn to the upper layer 102u of the light-emitting element layer 102 and are injected into the EML of the pixel, as indicated by arrows 120, basically by an electric field between the lower electrode 100 and the upper electrode 62 disposed to face the lower electrode 100.

On the other hand, some of the holes supplied from the lower electrode 100 to the lower layer 102d can travel toward the outside of the pixel opening 60 through the lower layer 102d as indicated by arrows 122. If the travel of the carriers becomes a leakage current that flows to the adjacent pixels, the above-mentioned problem arises. In this regard, in the organic EL display device 2, the lower layer 102d of the light-emitting element layer 102, which has the dividing area 112 formed in the pixel border, can prevent the leakage current from flowing to the adjacent pixels and causing the adjacent pixels to emit light. Thus, deterioration in resolution of images is prevented. Disposing the dividing area 112 in the borders between pixels of different luminescent colors can prevent color crosstalk due to the leakage current, provide high color purity, and thus achieve desirable color reproducibility.

In many cases, the layers constituting the lower layer 102d, among the auxiliary layers, are formed relatively thicker than the other auxiliary layers. Accordingly, a larger amount of carriers travel through the lower layer 102d to be the leakage current. In this regard, in this embodiment, providing the dividing area 112 for the lower layer 102d can well prevent the leakage current between pixels.

Alternatively, the OLEDs 6 may be white light-emitting OLEDs. For example, the OLED 6 that emits white light can have a tandem structure in which a plurality of OLEDs of different luminescent colors are electrically and serially connected via light-transmissive intermediate layers. In the tandem structure, a charge generation layer (CGL) disposed as an intermediate layer is also an auxiliary layer with carrier mobility, like the HIL and the HTL. The present invention can also be applied to the organic EL display device 2 having the tandem-structured OLEDs 6. Also in this case, like the above OLEDs 6 each of which emits single-color light, the dividing area 112, which is provided for the HTL/HIL layer 110 stacked on the lower electrodes 100, can well prevent the leakage current between pixels.

The dividing area 112 can be disposed along the entire circumference of the pixel border enclosing each pixel. That is, the HTL/HIL layer 110 can be divided into units of pixels by the dividing area 112.

As described above, disposing the dividing area 112 along the borders between adjacent pixels of mutually different luminescent colors can achieve desirable color reproducibility. For example, in this embodiment, the R, G, and B pixels are arranged in a stripe matrix, and a pair of pixels adjacent to each other in the row direction emit light mutually different in color. In this case, disposing the dividing area 112 along the pixel borders extending in the column direction can prevent color crosstalk between adjacent pixels.

The dividing area 112 may be formed not along all of the borders between adjacent pixels of mutually different luminescent colors but along only some portions of them.

In manufacture of the display panels 40, a method for forming a plurality of display panels 40 at once on a large piece of substrate 70 is adopted to increase the manufacturing efficiency. In this manufacturing method, during a process for forming TFTs on the substrate, the plurality of display panels 40 are processed together. On the other hand, during an OLED formation process, the plurality of display panels 40 are processed separately. That is, this manufacturing method is divided into the former and latter processes. In the former process, the plurality of display panels 40 are processed with all connected. In the latter process, the plurality of display panels 40 are divided into individual panels and the remaining processing is then applied to them. Here, the former process is referred to as the TFT process, and the latter process is referred to as the OLED process.

The TFT process basically includes steps that can be performed by using semiconductor manufacturing processes for manufacturing, for example, integrated circuits. The TFT process has a relatively high degree of flexibility in process conditions. For instance, a manufacturing process can be designed to use a high-temperature process at several hundred degrees Celsius. On the other hand, in the OLED process, the ambient temperature can be limited to several tens of degrees Celsius to prevent deterioration of the light-emitting element layer made of an organic material. That is, in the OLED process, processing the plurality of display panels 40 individually increases the number of steps, and the process conditions need to be controlled more accurately than the TFT process. Thus, by increasing the proportion of the TFT process in the process for manufacturing the display panels 40 and by reducing the proportion of the OLED process, the display panels 40 can be manufactured at lower costs and in shorter time periods.

In this embodiment, the TFT process includes a step of forming the structure shown in FIG. 4A. That is, a circuit including the TFTs 72 is formed on the substrate 70. Then, on the circuit, the planarization film 96 is stacked, and the lower electrodes 100 and the bank 106 are formed.

In this embodiment, the TFT process further includes a step of forming the lower layer 102d of the light-emitting element layer 102, and thus can effectively reduce the above manufacturing costs and shorten the above manufacturing time periods. That is, after the bank 106 is formed in the border area, further in the TFT process, the HTL/HIL layer 110 is formed throughout the display area 42 (FIG. 4B), the mask 116 is formed on the HTL/HIL layer 110, and the dividing area 112 is formed by using this mask 116 (FIG. 4C).

The OLED process includes a step of forming the upper layer 102u of the light-emitting element layer 102 (FIG. 4D), a step of forming the upper electrode 62 (FIG. 4E), and subsequent steps.

Second Embodiment

The following describes an organic EL display device 2b according to a second embodiment of the present invention.

This embodiment differs from the above first embodiment in the structure and the formation of the dividing area 112, whereas the other respects are essentially the same between these embodiments. The following describes the second embodiment mainly on differences from the first embodiment.

A schematic plan view of the display panel 40 of the organic EL display device 2b is essentially the same as that shown in FIG. 2 for the first embodiment. Thus, the second embodiment also refers to FIG. 2. FIG. 5 is a schematic vertical cross-sectional view of the display panel 40 in this embodiment taken along line III-III shown in FIG. 2. The dividing area 112 in the first embodiment is the area where the light-emitting element layer 102 has no lower layer 102d, which is an auxiliary layer with carrier mobility such as the HTL/HIL layer 110. In contrast, the dividing area 112 in this embodiment is the area where the material of the lower layer 102d is deteriorated or modified so as to lose carrier mobility. In FIG. 5, the dividing area 112 on the bank 106 has an altered layer 200 being the lower layer 102d that has lost carrier mobility.

For example, as in the first embodiment, the lower layer 102d and the mask 116 having the opening 114 in the area to be the dividing area 112 are formed (FIGS. 4B and 4C). In this embodiment, for example, ion implantation or energy ray irradiation, by using the mask 116, causes a chemical change in or molecular structure damage to the lower layer 102d (HTL/HIL layer 110), and thus causes the lower layer 102d to lose conductivity and become the altered layer 200.

After formation of the altered layer 200, the organic EL display device 2b in this embodiment is completed through essentially the same steps as those for the organic EL display device 2 in the first embodiment. For example, after formation of the altered layer 200, the light-emitting element layer 102 is formed by stacking the upper layer 102u (FIG. 4D), and then the OLEDs 6 are formed by forming the upper electrode 62 on the light-emitting element layer 102 (FIG. 4E).

The above embodiments describe how the dividing area 112 prevents the leakage current in the organic EL display device 2 (2b) in which the R, G, and B pixels are arranged in a stripe matrix, whereas such a structure for preventing the leakage current can be applied to other pixel arrangements.

The above embodiments and modifications describe cases where the lower electrode 100 is the anode of the OLED 6 and the upper electrode 62 is the cathode of the OLED 6. However, the present invention can also be applied to a case where the lower electrode 100 is the cathode of the OLED 6 and the upper electrode 62 is the anode of the OLED 6. In that case, the layers in the light-emitting element layer 102 are stacked in the reverse order of the above structure. For example, the light-emitting element layer 102 has a structure in which the EIL, the ETL, the EML, the HTL, and the HIL are stacked in this order from the lower electrode 100 used as the cathode.

Those skilled in the art can appropriately modify the design of the organic EL display devices 2 and 2b described above as embodiments of the present invention and implement other organic EL display devices, and all such organic EL display devices also fall within the scope of the invention as long as they come within the spirit of the invention. Display devices other than the organic EL display devices, for example, quantum dot display devices that employs quantum dot elements as their light-emitting layer, also fall within the scope of the invention.

Various other variations and modifications can be conceived by those skilled in the art within the spirit of the present invention, and it will be understood that all such variations and modifications also fall within the scope of the invention. For example, those skilled in the art can appropriately modify the above embodiments by addition, deletion, or design change of components, or by addition, omission, or condition change of steps, and all such modifications also fall within the scope of the invention as long as they come within the spirit of the invention.

It will also be understood that other effects produced by an aspect of the embodiment, which are apparent from the description herein or can be appropriately conceived by those skilled in the art, are produced by the present invention as a matter of course.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a plurality of pixels;
   pixel electrodes each provided in each of the plurality of pixels;
   a bank positioned in a border between the plurality of pixels, the bank exposing part of each of the pixel electrodes;
   an auxiliary layer on the pixel electrodes and the bank, the auxiliary layer including at least one of a carrier transport layer and a carrier injection layer;
   a light-emitting layer on the auxiliary layer; and
   a counter electrode positioned on the light-emitting layer, the counter electrode spreading over the plurality of pixels, wherein
   the auxiliary layer has a dividing area on the bank, and
   the dividing area has lower carrier mobility than an area of the auxiliary layer has, the area being different from the dividing area.

2. The display device according to claim 1, wherein
   the dividing area is positioned on a top of the bank, and
   the auxiliary layer is divided at the dividing area.

3. The display device according to claim 2, wherein
   the auxiliary layer is separated corresponding to the each of the plurality of pixels.

4. The display device according to claim 1, wherein
   the dividing area does not have the carrier mobility.

5. The display device according to claim 4, wherein
   deterioration of material of the auxiliary layer formed in the dividing area causes the dividing area to have lost the carrier mobility.

6. The display device according to claim 1, wherein
   the plurality of pixels include a first pixel of a first luminescent color and a second pixel of a second luminescent color adjacent to the first pixel, and
   the dividing area is disposed in at least part of a border between the first and second pixels.

7. The display device according to claim 1, wherein
   the display device is an organic EL display device, and
   the auxiliary layer includes a hole transport layer.

8. A display device comprising:
a plurality of pixels;
pixel electrodes each provided in each of the plurality of pixels;
a bank positioned in a border between the plurality of pixels, the bank exposing part of each of the pixel electrodes;
an auxiliary layer on the pixel electrodes and the bank, the auxiliary layer including at least one of a carrier transport layer and a carrier injection layer;
a light-emitting layer on the auxiliary layer; and
a counter electrode positioned on the light-emitting layer, the counter electrode spreading over the plurality of pixels, wherein
the auxiliary layer is divided on a top of the bank so as to correspond to the each of the plurality of pixels.

9. The display device according to claim 8, wherein
the plurality of pixels include a first pixel of a first luminescent color and a second pixel of a second luminescent color adjacent to the first pixel, and
the auxiliary layer is divided in at least part of a border between the first and second pixels.

10. The display device according to claim 8, wherein
the display device is an organic EL display device, and
the auxiliary layer includes a hole transport layer.

\* \* \* \* \*